US008742400B2

(12) United States Patent
Seo et al.

(10) Patent No.: US 8,742,400 B2
(45) Date of Patent: Jun. 3, 2014

(54) GRAPHENE SWITCHING DEVICE INCLUDING TUNABLE BARRIER

(71) Applicant: Samsung Electronics Co., Ltd., Suwon-Si (KR)

(72) Inventors: David Seo, Yongin-si (KR); Sang-wook Kim, Yongin-si (KR); Seong-jun Park, Seoul (KR); Young-jun Yun, Seongnam-si (KR); Yung-hee Yvette Lee, Seongnam-si (KR); Chang-seung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/861,726

(22) Filed: Apr. 12, 2013

(65) Prior Publication Data
US 2013/0277644 A1    Oct. 24, 2013

(30) Foreign Application Priority Data

Apr. 18, 2012 (KR) .................. 10-2012-0040415

(51) Int. Cl.
*H01L 29/06* (2006.01)

(52) U.S. Cl.
USPC ............... 257/29; 977/734; 977/814

(58) Field of Classification Search
USPC ..................... 257/29; 977/734, 814
See application file for complete search history.

(56) References Cited

U.S. PATENT DOCUMENTS

| 8,344,357 | B2 * | 1/2013 | Kobayashi | 257/24 |
| 8,344,358 | B2 * | 1/2013 | Avouris et al. | 257/24 |
| 8,569,121 | B2 * | 10/2013 | Haensch et al. | 438/160 |
| 2013/0001518 | A1 * | 1/2013 | Lin et al. | 257/29 |
| 2013/0048951 | A1 * | 2/2013 | Heo et al. | 257/29 |

* cited by examiner

*Primary Examiner* — Trung Q Dang
(74) *Attorney, Agent, or Firm* — Harness, Dickey, & Pierce, P.L.C.

(57) ABSTRACT

A graphene switching device includes a first electrode and an insulating layer in first and second regions of the semiconductor substrate, respectively, a plurality of metal particles on a surface of the semiconductor substrate between the first and second regions, a graphene layer on the plurality of metal particles and extending on the insulating layer, a second electrode on the graphene layer in the second region and configured to face the insulating layer, a gate insulating layer configured to cover the graphene layer, and a gate electrode on the gate insulating layer. The semiconductor substrate forms an energy barrier between the graphene layer and the first electrode.

16 Claims, 6 Drawing Sheets

GRAPHENE SWITCHING DEVICE INCLUDING TUNABLE BARRIER

CROSS-REFERENCE TO RELATED APPLICATIONS

This application claims the benefit of Korean Patent Application No. 10-2012-0040415, filed on Apr. 18, 2012 in the Korean Intellectual Property Office, the disclosure of which is incorporated herein in its entirety by reference.

BACKGROUND

1. Field

Example embodiments relate to graphene switching devices including a tunable semiconductor barrier, and more particularly, to graphene switching devices that include an element that changes the height of a tunable semiconductor barrier.

2. Description of the Related Art

Graphene, which has a 2-dimensional hexagonal carbon structure, is a new material that may replace semiconductors, and thus, recently worldwide studies about graphene have been actively conducted. Graphene is a zero gap semiconductor. When a graphene nano-ribbon (GNR) having a graphene channel width of 10 nm or less is formed, a band gap is formed by a size effect. Accordingly, a field effect transistor that may operate at room temperature may be manufactured by using the GNR.

When a graphene transistor is manufactured using a GNR, an on/off ratio of the graphene transistor is increased. However, the mobility of GNR is reduced and the on-current is relatively small due to disordered edges of the GNR. As a method of relieving the drawback of the GNR, recently, a band gap may be formed by applying an electric field in a perpendicular direction to a bi-layered graphene. However, it is not easy to realize this method because it is not easy to grow graphene having a uniform bi-layered graphene structure by using a large-area chemical vapor deposition (CVD) method, and also, there is a random domain in the bi-layered graphene.

SUMMARY

Example embodiments provide graphene switching devices that have a tunable barrier. The graphene switching device having a tunable barrier forms an energy barrier by using a semiconductor barrier instead of a graphene nano-ribbon, and the height of the semiconductor barrier is changed by disposing metal particles between the semiconductor barrier and the graphene layer.

Additional aspects will be set forth in part in the description which follows and, in part, will be apparent from the description, or may be learned by practice of example embodiments.

According to example embodiments, a graphene switching device may include a first electrode in a first region of a semiconductor substrate and an insulating layer in a second region of the semiconductor substrate, a plurality of metal particles on a surface of the semiconductor substrate between the first and second regions, a graphene layer on the plurality of metal particles and extending on the insulating layer, a second electrode on the graphene layer in the second region, the second electrode configured to face the insulating layer, a gate insulating layer configured to cover the graphene layer, and a gate electrode on the gate insulating layer. The semiconductor substrate may form an energy barrier between the graphene layer and the first electrode.

A plurality of grooves may be on the semiconductor substrate, the plurality of grooves configured to correspond to the plurality of metal particles, and an insulating material may be configured to fill the plurality of grooves. The plurality of metal particles may be embedded in the insulating material and upper surfaces of the plurality of metal particles may contact the graphene layer.

The plurality of metal particles may be on the insulating material and the graphene layer may be configured to surround a surface of the plurality of metal particles contacting the semiconductor substrate. An organic film may be between the plurality of metal particles and the graphene layer. The organic film may be formed of an organic material including one of an amino group, a hydroxyl group, and hydrogen ion. The organic film may have a thickness in a range from about 1 nm to about 3 nm.

The plurality of metal particles may have a size in a range from about 1 nm to about 10 nm. The plurality of metal particles may include gaps therebetween in a range from about 10 nm to about 30 nm. The semiconductor substrate may be formed of a material including one of silicon, germanium, silicon-germanium, a Group III-V semiconductor, a Group II-VI semiconductor, and $MoS_2$. The first electrode may be separate from the graphene layer by a gap. The gap between the graphene layer and the first electrode may be in a range from about 1 nm to about 30 nm.

The first and second electrodes may be formed of one of metal and polysilicon. The graphene switching device may be a unipolar transistor having a same polarity as that of a dopant of the semiconductor substrate. The energy barrier may change according to a gate voltage applied to the gate electrode. The graphene layer may include one to four graphene layers.

According to example embodiments, a graphene switching device may include a first electrode on a first region of a semiconductor substrate, and a graphene layer on a second region of the semiconductor substrate, the second region being separate from the first region.

The graphene switching device may further include an insulating layer and a plurality of metal particles contacting a surface of the graphene layer, a second electrode on the graphene layer in the second region, the second electrode configured to face the insulating layer, a gate insulating layer configured to cover the graphene layer, and a gate electrode on the gate insulating layer. A gap between the graphene layer and the first electrode is in a range from about 1 nm to about 30 nm.

According to example embodiments, a graphene switching device may include a first electrode in a first region of a semiconductor substrate and an insulating layer in a second region of the semiconductor substrate, a plurality of metal particles on a surface of the semiconductor substrate between the first and second regions, and a graphene layer on the plurality of metal particles and extending on the insulating layer.

The graphene switching device may further include a second electrode on the graphene layer in the second region, the second electrode configured to face the insulating layer, a gate insulating layer configured to cover the graphene layer, a gate electrode on the gate insulating layer, a plurality of grooves on the semiconductor substrate, the plurality of grooves configured to correspond to the plurality of metal particles, and an insulating material configured to fill the plurality of grooves.

The plurality of metal particles may be embedded in the insulating material and upper surfaces of the plurality of metal particles may contact the graphene layer. The plurality of metal particles may be on the insulating material and the graphene layer may be configured to surround a surface of the plurality of metal particles contacting the semiconductor substrate.

According to example embodiments, the graphene switching device having a tunable barrier forms an energy barrier between an electrode and a graphene layer by using a semiconductor barrier. Therefore, a channel width of the graphene switching device is not restricted like in a graphene nano ribbon, and thus, graphene defect in a graphene patterning process may be prevented or reduced.

Also, an operating current of the graphene switching device may be reduced by forming metal particles between the semiconductor barrier and the graphene layer, thereby reducing a driving power of the graphene switching device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
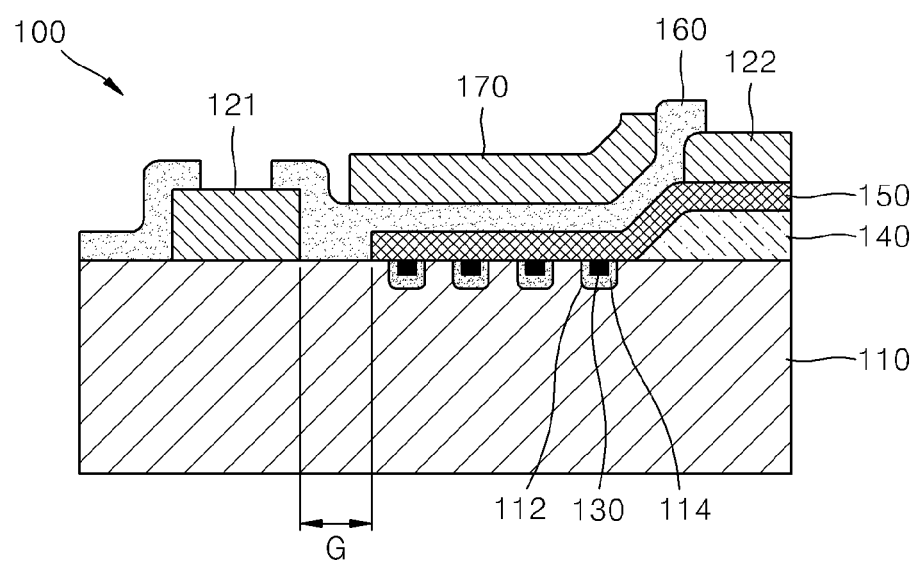
FIG. 1 is a schematic cross-sectional view of a graphene switching device having a tunable barrier according to example embodiments.

Example embodiments will now be described more fully with reference to the accompanying drawings in which example embodiments are shown. In the drawings, the thicknesses of layers and regions are exaggerated for clarity, and like reference numerals refer to like elements throughout the specification and the detailed descriptions thereof are omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper", "vertical", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" other elements or features would then be oriented "above" the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a graphene switching device 100 having a tunable barrier according to example embodiments.

Referring to FIG. 1, a first electrode 121 may be disposed on a first region of a semiconductor substrate 110, and an insulating layer 140 may be formed on a second region that is separated from the first region. A graphene layer 150 may be formed in a third region on the semiconductor substrate 110 between the first and second regions extending onto the insulating layer 140. One end of the graphene layer 150 may be separated from the first electrode 121 by a gap G which may be in a range from about 1 nm to about 30 nm. A second electrode 122 may be formed on the graphene layer 150 in the second region to face the insulating layer 140.

In FIG. 1, the insulating layer 140 may be formed on a surface of the semiconductor substrate 110, but example embodiments are not limited thereto. For example, the insulating layer 140 may be formed by oxidizing the surface of the semiconductor substrate 110.

A plurality of grooves 112 may be formed in the surface of the semiconductor substrate 110. A metal particle 130 that contacts the graphene layer 150 may be disposed in each of the grooves 112. An insulating material 114 that surrounds the metal particle 130 may be formed in each of the grooves 112 to prevent or inhibit the metal particle 130 from contacting the semiconductor substrate 110. The metal particles 130 may be formed of a material selected from the group consisting of platinum (Pt), gold (Au), palladium (Pd), cobalt (Co), yttrium (Y), gadolinium (Gd), and titanium (Ti). Each metal particle 130 may have a size in a range from about 1 nm to about 10 nm. The metal particles 130 may be formed to have gaps therebetween in a range from about 10 nm to about 30 nm.

Trenches having a relatively high aspect ratio may be formed instead of the grooves 112. In example embodiments, the metal particles 130 may be formed to have an aspect ratio in a range from about 1 to about 10.

A gate insulating layer 160 that covers a portion of the graphene layer 150 may be formed on the semiconductor substrate 110. A gate electrode 170 may be formed on the gate insulating layer 160.

The first electrode 121 and the second electrode 122 respectively may be one of a source electrode and a drain electrode, and may be formed of metal or polysilicon.

The semiconductor substrate 110 may be formed of a material selected from a group consisting of silicon, germanium, silicon-germanium, a Group III-V semiconductor, a Group II-VI semiconductor, and an $MoS_2$ single layer as a two dimensional semiconductor. The semiconductor substrate 110 may be doped with one of an n-type dopant and a p-type dopant. As shown in FIG. 1, the semiconductor substrate 110 may be disposed to face the gate electrode 170 with the graphene layer 150 therebetween. Accordingly, an energy band of the semiconductor substrate 110 is affected by a gate voltage.

The gate insulating layer 160 may be formed of silicon oxide or silicon nitride. The graphene layer 150 may be formed by patterning graphene after transferring the graphene that is formed by a chemical vapor deposition (CVD) method. The graphene layer 150 may include one to four graphene layers. The graphene layer 150 may be a moving path of carriers and may have a zero band gap.

The graphene switching device 100 that has a tunable barrier may be a unipolar transistor that may be an n-type transistor or a p-type transistor according to a polarity of the semiconductor substrate 110. That is, if the semiconductor substrate 110 is doped with an n-type dopant, the graphene switching device 100 that has a tunable barrier is an n-type transistor. Otherwise, if the semiconductor substrate 110 is doped with a p-type dopant, the graphene switching device 100 that has a tunable barrier is a p-type transistor.

FIGS. 2A through 2D are energy band diagrams for explaining an operation of the graphene switching device 100 of FIG. 1, according to example embodiments.

Figure 2A:
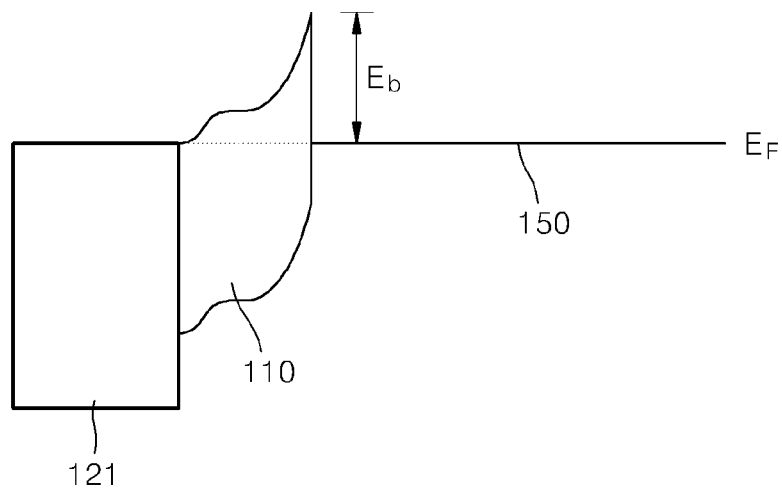
FIGS. 2A through 2D are energy band diagrams for explaining an operation of the graphene switching device of FIG. 1, according to example embodiments.
Figure 2B:
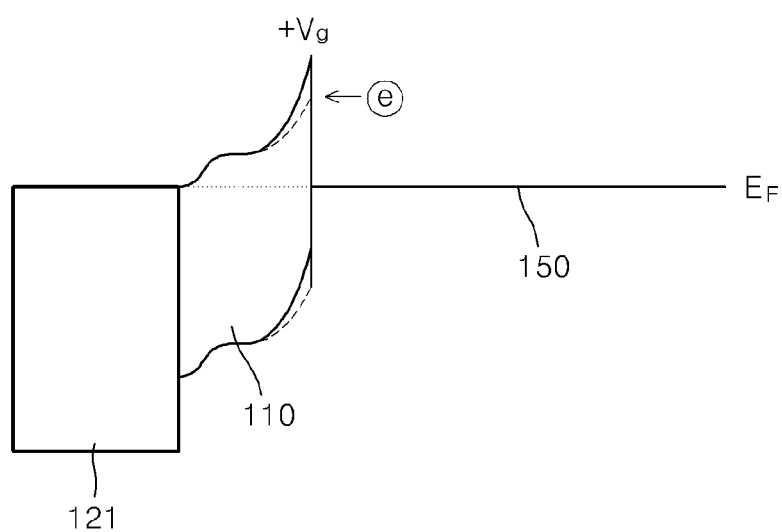

FIGS. 2A and 2B are energy band diagrams for explaining an operation of an n-type graphene switching device 100 having a tunable barrier that does not include metal particles. FIG. 2A shows a state before applying a gate voltage and FIG. 2B shows a state of applying a gate voltage.

Referring to FIG. 2A, in a state that a gate voltage is not applied to the gate electrode 170 (see FIG. 1), energy band structures corresponding to respective work functions of the graphene layer 150 and the first electrode 121 are respectively formed on both sides of the semiconductor substrate 110. Because the graphene switching device 100 includes an n-type semiconductor substrate 110, main carriers are electrons. The semiconductor substrate 110 between the first electrode 121 and the graphene layer 150 is an energy barrier Eb therebetween. In example embodiments, the semiconductor substrate 110 is also referred to as a semiconductor barrier. The mobility of the carriers is restricted by an energy barrier Eb between the graphene layer 150 and the semiconductor substrate 110. In FIGS. 2A and 2B, $E_F$ indicates a Fermi energy level of the graphene layer 150.

Referring to FIG. 2B, in a state that a predetermined or given voltage is applied to the first electrode 121 and the second electrode 122, when a predetermined or given positive gate voltage +Vg is applied to the gate electrode 170, the energy barrier Eb of the semiconductor substrate 110 may be reduced as indicated by dashed lines due to the variation of work function of the graphene layer 150. Accordingly, electrons are readily moved from the graphene layer 150 to the first electrode 121. This denotes that current flows in the graphene switching device 100 due to the gate voltage, and thus, the graphene switching device 100 functions as a field effect transistor. The graphene layer 150 is a carrier pathway, and a work function of the graphene layer 150 varies according to the gate voltage.

Due to the reduction of the energy barrier Eb, electrons may pass through the semiconductor substrate 110 due to the tunneling effect. As the gate voltage increases, the energy barrier Eb of the semiconductor substrate 110 is further reduced. Accordingly, the energy barrier Eb of the semiconductor substrate 110 may be controllable.

Figure 3:
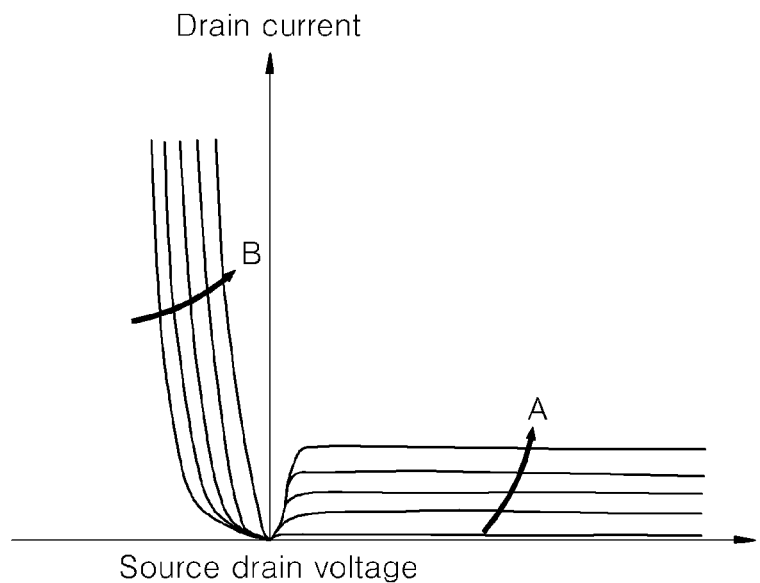
FIG. 3 is an I-V characteristic curve of an n-type graphene switching device according to example embodiments.

FIG. 3 is an I-V characteristic curve of an n-type graphene switching device according to example embodiments. Referring to FIG. 3, when a source-drain voltage is positive, as the gate voltage increases, the energy barrier Eb is reduced and the drain current increases in a direction indicated by an arrow A.

When a negative voltage is applied to the first electrode 121 of the graphene switching device 100 that includes an n-type semiconductor substrate 110, electrons flow relatively well as shown in FIG. 3. However, when a positive voltage is applied to the first electrode 121, current may not flow as well due to an energy barrier Eb. Accordingly, the graphene switching device 100 may function as a diode. Because the height of the energy barrier Eb is controlled by a gate voltage, the drain current increases in a direction indicated by an arrow B, and thus, the diode characteristic of the graphene switching device 100 may be controlled.

Figure 2C:
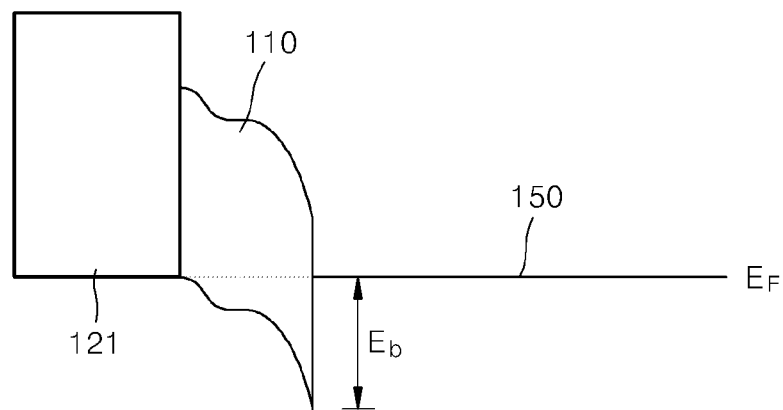
Figure 2D:
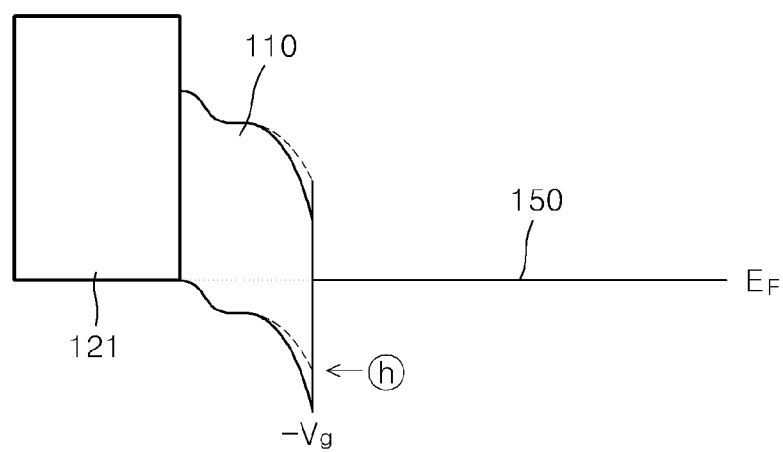

FIGS. 2C and 2D are energy band diagrams for explaining an operation of a p-type graphene switching device 100. FIG.

2C shows a state before applying a gate voltage and FIG. 2D shows a state of applying a gate voltage.

Referring to FIG. 2C, in a state that no voltage is applied to the gate electrode 170 (see FIG. 1), energy band structures corresponding to work functions of the graphene layer 150 and the first electrode 121 are respectively formed on both sides of the semiconductor substrate 110. Because the graphene switching device 100 includes a p-type semiconductor substrate 110, main carriers are holes. The semiconductor substrate 110 between the first electrode 121 and the graphene layer 150 is an energy barrier Eb therebetween. The mobility of the carriers is restricted by an energy barrier Eb of the semiconductor substrate 110. In FIGS. 2C and 2D, $E_F$ indicates a Fermi energy level of the graphene layer 150.

Referring to FIG. 2D, in a state that a predetermined or given voltage is applied to the first electrode 121 and the second electrode 122, when a predetermined or given negative gate voltage −Vg is applied to the gate electrode 170, an energy barrier Eb of the semiconductor substrate 110 is reduced as indicated by dashed lines. Accordingly, holes are readily moved from the graphene layer 150 to the first electrode 121. This denotes that current flows in the graphene switching device 100 due to the gate voltage, and thus, the graphene switching device 100 functions as a field effect transistor.

Due to the reduction of the energy barrier Eb of the semiconductor substrate 110, holes may pass through the semiconductor substrate 110 due to the tunneling effect.

As the gate voltage increases, the energy barrier Eb of the semiconductor substrate 110 is further reduced. Accordingly, the energy barrier Eb of the semiconductor substrate 110 is controllable.

Figure 4:
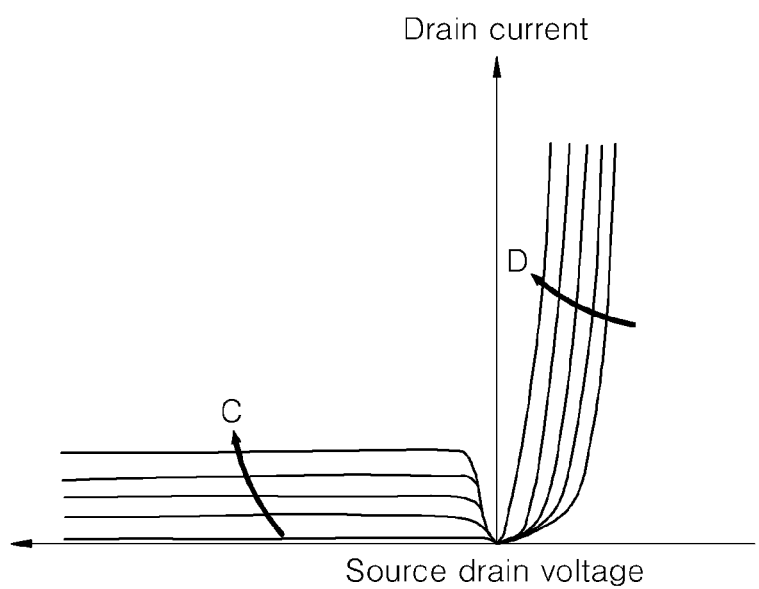
FIG. 4 is an I-V characteristic curve of a p-type graphene switching device according to example embodiments.

FIG. 4 is an I-V characteristic curve of a p-type graphene switching device according to example embodiments. Referring to FIG. 4, when a source-drain voltage is negative, as the gate voltage increases, a drain current is increased in a direction indicated by an arrow C.

When a positive voltage is applied to the first electrode 121 of the graphene switching device 100 that includes a p-type semiconductor substrate 110, holes flow relatively well over the energy barrier Eb. However, when a negative voltage is applied to the first electrode 121, holes may not flow as well due to the energy barrier Eb. Accordingly, the graphene switching device 100 functions as a diode. Also, at this point, because the height of the energy barrier Eb is controlled at a relatively low level due to the increase in the gate voltage, the drain current increase in a direction indicated by an arrow D, and thus, the diode characteristic of the graphene switching device 100 may be controlled.

Hereinafter, an operation of the metal particles 130 in the graphene switching device 100 is described. The metal particles 130 change the height of the energy barrier Eb of the semiconductor substrate 110. That is, the height of the energy barrier Eb of the graphene switching device 100 is controlled according to the applied gate voltage, and the height of the energy barrier Eb of the semiconductor substrate 110 is changed due to the metal particles 130.

When the semiconductor substrate 110 is an n-type silicon substrate in which Pt, Au, Pd, or Co, which has a work function approximately in a range from about 4.5 eV to about 6.0 eV higher than silicon, is used as the metal particles 130, the energy barrier Eb between the graphene layer 150 and the semiconductor substrate 110 is reduced. Also, when Y, Gd, or Ti which has a work function approximately in a range from 3.0 eV to 4.5 eV lower than silicon is used as the metal particles 130, the energy barrier Eb of the semiconductor substrate 110 is increased. When the semiconductor substrate 110 is a p-type silicon substrate, a phenomenon opposite to the above occurs.

Figure 5:
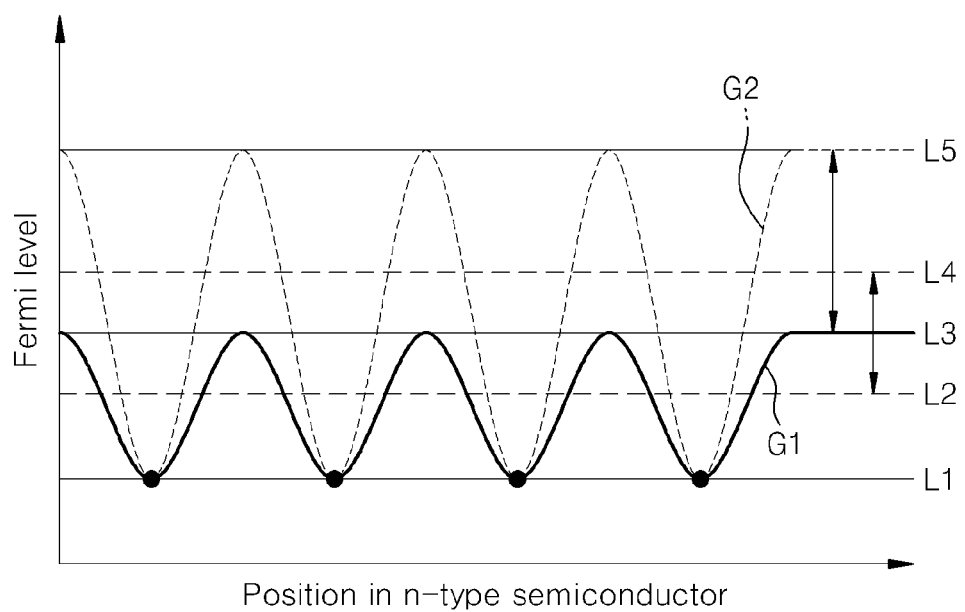
FIG. 5 is a graph showing an operation of metal particles in a graphene switching device according to example embodiments.

FIG. 5 is a graph showing an operation of metal particles 130 in a graphene switching device 100 according to example embodiments. In FIG. 5, black circles indicate metal particles 130. When the semiconductor substrate 110 is, for example, an n-type silicon substrate and the metal particles 130 are formed of metal having a work function lower than Si, a Fermi energy level of the graphene layer 150 is fixed at level 1 L1 which is the Fermi energy level of the metal particles 130, and the level 1 L1 is lower than the level 3 L3 which is the Fermi energy level of the graphene layer 150. Accordingly, as shown in a first graph G1, according to the position on the semiconductor substrate 110, the Fermi energy level of the graphene layer 150 may be expressed as a predetermined or given curve between the Fermi energy level L1 of the metal particles 130 and the Fermi energy level L3 of the graphene layer 150. A level 2 L2 indicates an average Fermi energy level of the graphene layer 150 in a state that a gate voltage is not applied.

When a positive gate voltage is applied to the gate electrode 170, the Fermi energy level of the graphene layer 150 is increased to level 5 L5. As shown in second graph G2, the height of the curve between the Fermi energy level L1 of the metal particles 130 and the Fermi energy level L5 of the graphene layer 150 is increased. A level 4 L4 indicates an average Fermi energy level of the graphene layer 150 in a state that a positive gate voltage is applied.

Accordingly, in a graphene switching device that does not include the metal particles 130, a driving current occurs between the level 3 L3 and the level 5 L5. However, in a graphene switching device that includes the metal particles 130, a driving current occurs between the level 2 L2 and the level 4 L4. Due to the metal particles 130, the magnitude of a driving current is reduced, and accordingly, the driving power of the graphene switching device 100 is reduced.

When the semiconductor substrate 110 is, for example, a p-type semiconductor substrate and the metal particles 130 are formed of metal that has a work function higher than that of the semiconductor substrate 110, the driving power of the graphene switching device 100 is also reduced, and the detailed descriptions thereof will not be repeated.

Figure 6:
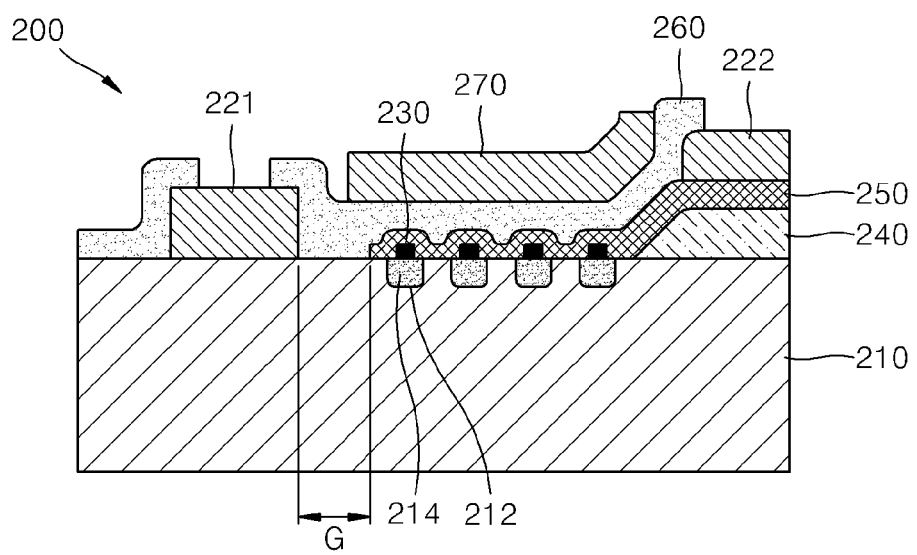
FIG. 6 is a schematic cross-sectional view of a graphene switching device having a tunable barrier according to example embodiments.

FIG. 6 is a schematic cross-sectional view of a graphene switching device 200 having a tunable barrier according to example embodiments. Referring to FIG. 6, a first electrode 221 may be disposed on a first region of a semiconductor substrate 210, and an insulating layer 240 may be formed on a second region separated from the first region of the semiconductor substrate 210. A graphene layer 250 may be formed in a third region on the semiconductor substrate 210 between the first and second regions extending onto the insulating layer 240. One end of the graphene layer 250 may be separated from the first electrode 221 by a gap G which may be in a range from about 1 nm to about 30 nm. A second electrode 222 may be formed on the graphene layer 250 in the second region to face the insulating layer 240.

A plurality of grooves 212 may be formed on a surface of the semiconductor substrate 110. A metal particle 230 that contacts the graphene layer 250 may be disposed on the insulating material 214. The graphene layer 250 may be formed to surround the metal particles 230 and to contact the semiconductor substrate 210. The metal particles 230 may be formed of a material selected from a group consisting of Pt, Au, Pd, Co, Y, Gd, and Ti. Each metal particle 230 may have a size in a range from about 1 nm to about 10 nm. The metal particles 230 may be formed having gaps therebetween in a range from about 10 nm to about 30 nm.

A gate insulating layer 260 that covers a portion of the graphene layer 250 may be formed on the semiconductor substrate 210. A gate electrode 270 may be formed on the gate insulating layer 260.

The first electrode 221 and the second electrode 222 respectively may be one of a source electrode and a drain electrode. The first electrode 221 and the second electrode 222 may be formed of metal or polysilicon.

The semiconductor substrate 210 may be formed of a material selected from a group consisting of silicon, germanium, silicon-germanium, a Group III-V semiconductor, a Group II-VI semiconductor, and an $MoS_2$ single layer as a two dimensional semiconductor. The semiconductor substrate 210 may be doped with either a p-type dopant or an n-type dopant. As depicted in FIG. 6, the semiconductor substrate 210 may be disposed to face the gate electrode 270 with the graphene layer 250 therebetween. Accordingly, an energy band of the semiconductor substrate 210 may be affected by a gate voltage.

The gate insulating layer 260 may be formed of silicon oxide or silicon nitride. The graphene layer 250 may be formed by patterning graphene after transferring the graphene that is formed by a chemical vapor deposition (CVD) method. The graphene layer 250 may include one to four graphene layers. The graphene layer 250 may be a moving path of carriers and may have a zero band gap.

The graphene switching device 200 that has a tunable barrier may be a unipolar transistor that is an n-type transistor or a p-type transistor according to a polarity of the semiconductor substrate 210. That is, if the semiconductor substrate 210 is doped with an n-type dopant, the graphene switching device 200 that has a tunable barrier is an n-type transistor, and if the semiconductor substrate 210 is doped with a p-type dopant, the graphene switching device 200 that has a tunable barrier is a p-type transistor.

The operation of the graphene switching device 200 that has a tunable barrier according to example embodiments is substantially the same as the operation of the graphene switching device 100 that has a tunable barrier of FIG. 1, and thus, detailed description thereof will not be repeated.

Figure 7:
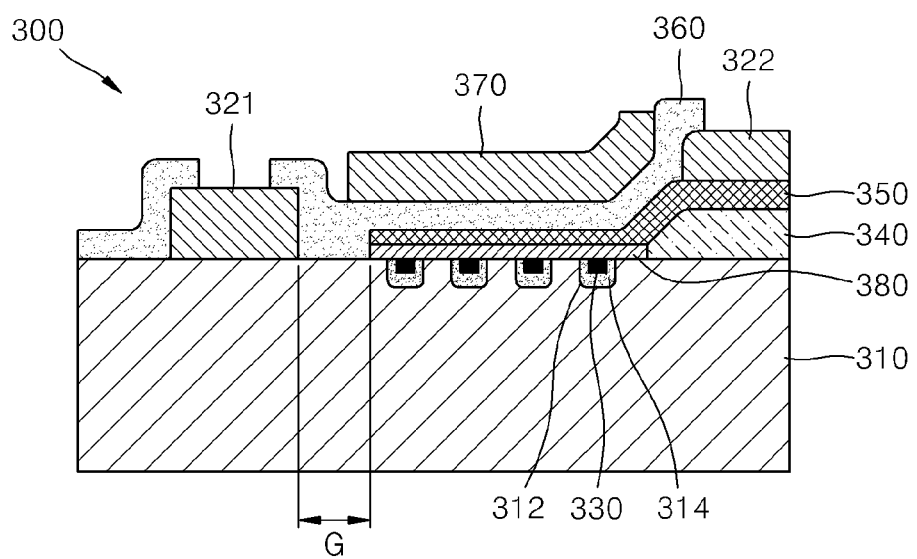
FIG. 7 is a schematic cross-sectional view of a graphene switching device having a tunable barrier according to example embodiments.

FIG. 7 is a schematic cross-sectional view of a graphene switching device 300 having a tunable barrier according to example embodiments. Referring to FIG. 7, a first electrode 321 may be disposed on a first region of a semiconductor substrate 310, and an insulating layer 340 may be formed on a second region separated from the first region of the semiconductor substrate 310. A graphene layer 350 may be formed on a third region on the semiconductor substrate 310 between the first and second regions extending onto the insulating layer 340. The graphene layer 350 may be separated from the first electrode 321. A separation gap G between the graphene layer 350 and the first electrode 321 may be in a range from about 1 nm to about 30 nm. A second electrode 322 may be formed on the graphene layer 350 in the second region to face the insulating layer 340.

A plurality of grooves 312 may be formed on a surface of the semiconductor substrate 310. A metal particle 330 that contacts the graphene layer 350 may be disposed in each of the grooves 312. An insulating material 314 that surrounds the metal particles 330 may be formed in each of the grooves 312 to prevent or inhibit the metal particles 330 from contacting the semiconductor substrate 310. The metal particles 330 may be formed of a material selected from the group consisting of Pt, Au, Pd, Co, Y, Gd, and Ti. Each metal particle 330 may have a size in a range from about 1 nm to about 10 nm.

The metal particles 330 may be formed having gaps therebetween in a range from about 10 nm to about 30 nm.

An organic film 380 may be disposed between the graphene layer 350 and the semiconductor substrate 310 in the third region of the semiconductor substrate 310. The organic film 380 may be formed of an organic material that includes an amino group, a hydroxyl group, or hydrogen ions. An organic material that includes an amino group may be 1-Pyrenebutanamine, Cysteamine, or 3-Aminopropyltriethoxysilane. An organic material that includes a hydroxyl group may be 7-hydrobenzo(a)pyrene, or 1-pyrenebutanol.

The organic film 380 may be formed to have a thickness through which tunneling is possible, for example, in a range from about 1 nm to about 3 nm. The organic film 380 may change the Fermi energy level of the graphene layer 350 on the semiconductor substrate 310 by combining with a dangling bond on the surface of the semiconductor substrate 310.

A gate insulating layer 360 that covers a portion of the graphene layer 350 may be formed on the semiconductor substrate 310. A gate electrode 370 may be formed on the gate insulating layer 360.

The first electrode 321 and the second electrode 322 respectively may be one of a source electrode and a drain electrode. The first electrode 321 and the second electrode 322 may be formed of metal or polysilicon.

The semiconductor substrate 310 may be formed of a material selected from the group consisting of silicon, germanium, silicon-germanium, a Group III-V semiconductor, a Group II-VI semiconductor, and an $MoS_2$ single layer as a two dimensional semiconductor. The semiconductor substrate 310 may be doped with either a p-type dopant or an n-type dopant. As depicted in FIG. 7, the semiconductor substrate 310 may be disposed to face the gate electrode 370 with the graphene layer 350 therebetween. Accordingly, an energy band of the semiconductor substrate 310 may be affected by a gate voltage.

The gate insulating layer 360 may be formed of silicon oxide or silicon nitride.

The graphene layer 350 may be formed by patterning graphene after transferring the graphene that is formed by a CVD method. The graphene layer 350 may include one to four graphene layers. The graphene layer 350 may be a moving path of carriers and may have a zero band gap.

The graphene switching device 300 that has a tunable barrier may be a unipolar transistor that is an n-type transistor or a p-type transistor according to a polarity of the semiconductor substrate 310. That is, if the semiconductor substrate 310 is doped with an n-type dopant, the graphene switching device 300 that has a tunable barrier is an n-type transistor, and if the semiconductor substrate 310 is doped with a p-type dopant, the graphene switching device 300 that has a tunable barrier is a p-type transistor.

The operation of the graphene switching device 300 that has a tunable barrier according to example embodiments is substantially the same as the operation of the graphene switching device 100 that has a tunable barrier of FIG. 1, and thus, detailed description thereof will not be repeated.

In FIG. 7, it is shown that the organic film 380 is applied to the graphene switching device 100. However, example embodiments are not limited thereto. For example, the organic film 380 of FIG. 7 may be disposed to cover the metal particles 230 between the semiconductor substrate 210 and the graphene layer 250 in the graphene switching device 200, and the description thereof is omitted.

While the inventive concepts have been particularly shown and described with reference to example embodiments thereof, it will be understood by those of ordinary skill in the art that various changes in form and details may be made therein without departing from the spirit and scope of example embodiments as defined by the following claims.

What is claimed is:

1. A graphene switching device comprising:
   a first electrode in a first region of a semiconductor substrate and an insulating layer in a second region of the semiconductor substrate;
   a plurality of metal particles on a surface of the semiconductor substrate between the first and second regions;
   a graphene layer on the plurality of metal particles and extending on the insulating layer;
   a second electrode on the graphene layer in the second region, the second electrode configured to face the insulating layer;
   a gate insulating layer configured to cover the graphene layer; and
   a gate electrode on the gate insulating layer,
   wherein the semiconductor substrate forms an energy barrier between the graphene layer and the first electrode.

2. The graphene switching device of claim 1, further comprising:
   a plurality of grooves on the semiconductor substrate, the plurality of grooves configured to correspond to the plurality of metal particles; and
   an insulating material configured to fill the plurality of grooves.

3. The graphene switching device of claim 2, wherein the plurality of metal particles are embedded in the insulating material and upper surfaces of the plurality of metal particles contact the graphene layer.

4. The graphene switching device of claim 2, wherein the plurality of metal particles are on the insulating material and the graphene layer is configured to surround a surface of the plurality of metal particles contacting the semiconductor substrate.

5. The graphene switching device of claim 2, further comprising:
   an organic film between the plurality of metal particles and the graphene layer.

6. The graphene switching device of claim 5, wherein the organic film is formed of an organic material including one of an amino group, a hydroxyl group, and hydrogen ion.

7. The graphene switching device of claim 5, wherein the organic film has a thickness in a range from about 1 nm to about 3 nm.

8. The graphene switching device of claim 2, wherein the plurality of metal particles have a size in a range from about 1 nm to about 10 nm.

9. The graphene switching device of claim 2, wherein the plurality of metal particles include gaps therebetween in a range from about 10 nm to about 30 nm.

10. The graphene switching device of claim 1, wherein the semiconductor substrate is formed of a material including one of silicon, germanium, silicon-germanium, a Group III-V semiconductor, a Group II-VI semiconductor, and $MoS_2$.

11. The graphene switching device of claim 1, wherein the first electrode is separate from the graphene layer by a gap.

12. The graphene switching device of claim 11, wherein the gap between the graphene layer and the first electrode is in a range from about 1 nm to about 30 nm.

13. The graphene switching device of claim 1, wherein the first and second electrodes are formed of one of metal and polysilicon.

14. The graphene switching device of claim 1, wherein the graphene switching device is a unipolar transistor having a same polarity as that of a dopant of the semiconductor substrate.

15. The graphene switching device of claim 1, wherein the energy barrier changes according to a gate voltage applied to the gate electrode.

16. The graphene switching device of claim 1, wherein the graphene layer includes one to four graphene layers.

* * * * *